(12) United States Patent
Kim et al.

(10) Patent No.: US 10,158,078 B2
(45) Date of Patent: Dec. 18, 2018

(54) COMPOSITION FOR INSULATOR OF THIN FILM TRANSISTOR, INSULATOR AND ORGANIC THIN FILM TRANSISTOR PREPARED THEREBY

(71) Applicant: Korea Research Institute of Chemical Technology, Daejeon (KR)

(72) Inventors: Yun Ho Kim, Daejeon (KR); Sung Mi Yoo, Daejeon (KR); So Hee Kim, Daejeon (KR); Mihye Yi, Daejeon (KR); Jae Won Ka, Daejeon (KR); Jinsoo Kim, Daejeon (KR); Jong Chan Won, Daejeon (KR); Kwang Suk Jang, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 0 days.

(21) Appl. No.: 15/581,413

(22) Filed: Apr. 28, 2017

(65) Prior Publication Data
US 2017/0331042 A1 Nov. 16, 2017

(30) Foreign Application Priority Data
May 12, 2016 (KR) .................. 10-2016-0058108

(51) Int. Cl.
*C08L 37/00* (2006.01)
*H01L 51/00* (2006.01)
*H01L 51/05* (2006.01)
*H01L 51/10* (2006.01)

(52) U.S. Cl.
CPC .......... *H01L 51/0035* (2013.01); *C08L 37/00* (2013.01); *H01L 51/0052* (2013.01); *H01L 51/0074* (2013.01); *C08L 2203/20* (2013.01); *C08L 2205/025* (2013.01); *H01L 51/0026* (2013.01); *H01L 51/052* (2013.01); *H01L 51/0545* (2013.01); *H01L 51/0566* (2013.01);
(Continued)

(58) Field of Classification Search
None
See application file for complete search history.

(56) References Cited

U.S. PATENT DOCUMENTS 9,035,287 B2    5/2015  Facchetti et al.
9,650,487 B1 *  5/2017  Guo ..................... C08J 9/28
(Continued)

FOREIGN PATENT DOCUMENTS

KR    10-2011-0132978    12/2011
KR    10-2012-0100591    9/2012
WO    WO 83/03165       * 9/1983

*Primary Examiner* — Erik Kielin
(74) *Attorney, Agent, or Firm* — Leydig, Voit & Mayer, Ltd.

(57) ABSTRACT

The present invention relates to a composition for an insulator of a thin film transistor, an insulator and an organic thin film transistor comprising the same. The insulator of a thin film transistor prepared with the composition of the present invention displays an excellent permittivity along with a low surface energy, and the organic thin film transistor comprising the same displays an improved organic semiconductor morphology formed on the top surface of the insulator, so that it can bring the effect of reducing leakage current density, improving charge carrier mobility, and improving current on/off ratio.

10 Claims, 8 Drawing Sheets

(52) U.S. Cl.
CPC ...... *H01L 51/105* (2013.01); *H01L 2251/301* (2013.01)

(56) References Cited

U.S. PATENT DOCUMENTS

| | | | |
|---|---|---|---|
| 2011/0092636 A1* | 4/2011 | Parthiban | C08F 8/36 524/548 |
| 2011/0175089 A1* | 7/2011 | Zheng | C08G 63/912 257/57 |

* cited by examiner

COMPOSITION FOR INSULATOR OF THIN FILM TRANSISTOR, INSULATOR AND ORGANIC THIN FILM TRANSISTOR PREPARED THEREBY

CROSS-REFERENCE TO RELATED APPLICATIONS

This application is a U.S. Nonprovisional application filed under 35 U.S.C. § 111(a) which claims the benefit of Korean Application No. 10-2016-0058108, filed May 12, 2016. This application is hereby incorporated by reference in its entirety.

BACKGROUND OF THE INVENTION

Field of the Invention

The present invention relates to a composition for an insulator of a thin film transistor, an insulator and an organic thin film transistor comprising the same.

Description of the Related Art

The organic thin film transistor recently has been a major target of study because of its broad application, low price, and potential for application to organic electronic device.

Conductors, semiconductors and insulating materials are all necessary for the preparation of an organic thin film transistor. Various organic semiconductors have been reported so far for the organic thin film transistor.

The self-assembled monolayer silicon oxide is generally applied to a gate insulator, which is because of the excellent device performance shown in the bottom gate organic thin film transistor.

According to the previous reports, octadecyltrichlorosilane (ODTS), hexamethyldisilasane, and phenyltrichlorosilane self-assembled monolayer silicon oxide gate insulators display low charge trap site density and modified surface energy.

Interface properties of a gate insulator are closely related to the performance of an organic thin film transistor, which is because the charge carrier mobility is limited in the first layer of an organic semiconductor. In the bottom gate organic thin film transistor, the adhesion and early growth of an organic semiconductor are affected by the interface properties of the gate insulator.

For large area, low cost, and flexible electronic device applications, the thermally grown silicon oxide gate insulator must be replaced by an organic gate insulator prepared by a solution process. However, it is still necessary to improve the performance of an organic thin film transistor including an organic gate insulator. Korean Patent No. 10-1288622 describes a method for generating an organic semiconductor layer of the organic thin film transistor that is suitable for better crystal direction of the organic semiconductor layer, the organic thin film transistor generated by the method, the display element comprising the same, and the display device generated by the display element.

There are two major limiting factors to obtain a high performance organic thin film transistor including an organic gate insulator. The first limiting factor is the low capacitance of the gate insulator. To obtain a high capacitance, the thickness of the gate insulator has to be thin. In general, a reduction in the thickness of the organic gate insulator may indicate a significant reduction in. In general, the decrease of the thickness of the organic gate insulator results in the significant decrease of electrical insulation performance. The density of electrical pathways, such as defects, grain boundaries and pinholes, can be increased by reducing the thickness of the organic gate insulator in a certain range. The second limiting factor is the relatively high surface energy of the organic gate insulator. Unlike the silicon oxide gate insulator, the surface performance modification of the organic gate insulator is further limited by the lack of functional groups.

Thus, the present inventors have studied a thin organic insulator with a low surface energy. In the course of the study, the inventors developed an organic insulator comprising a cross-linked material prepared by mixing poly(ethylene-alt-maleic anhydride), a cross-linking agent, and poly(maleic anhydride-alt-1-alkene) and an organic thin film transistor comprising the same, leading to the completion of the present invention.

SUMMARY OF THE INVENTION

It is an object of the present invention to provide a composition for a thin film transistor insulator displaying a reduced surface energy but an excellent permittivity, an insulator and an organic thin film transistor comprising the same.

To achieve the above object, the present invention provides a composition for a thin film transistor insulator comprising poly(ethylene-alt-maleic anhydride) (PEMA), a cross-linking agent, and a polymer comprising the repeating unit represented by formula 1 below.

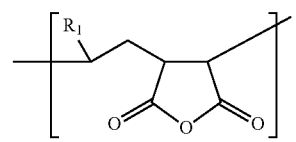

[Formula 1]

(In the formula 1, $R_1$ is $C_1$~$C_{22}$ straight or branched alkyl.).

The present invention also provides an insulator for a thin film transistor prepared with the composition above.

Further, the present invention provides a method for preparing the insulator for the thin film transistor comprising the step of spreading the composition above on a substrate, followed by heat-treatment (step 1).

In addition, the present invention provides an organic thin film transistor comprising:
a gate electrode formed on a substrate;
a gate insulator comprising the gate electrode and the insulator formed on the substrate;
an organic semiconductor formed on the gate insulator;
a source electrode formed on the organic semiconductor; and
a drain electrode.

Advantageous Effect

The insulator for a thin film transistor prepared with the composition of the present invention displays an excellent permittivity along with a low surface energy, and the organic thin film transistor comprising the same displays an improved organic semiconductor morphology formed on the top surface of the insulator, so that it can bring the effect of reducing leakage current density, improving charge carrier mobility, and improving current on/off ratio.

BRIEF DESCRIPTION OF THE DRAWINGS

The application of the preferred embodiments of the present invention is best understood with reference to the accompanying drawings, wherein.

DETAILED DESCRIPTION OF THE INVENTION

Figure 1:
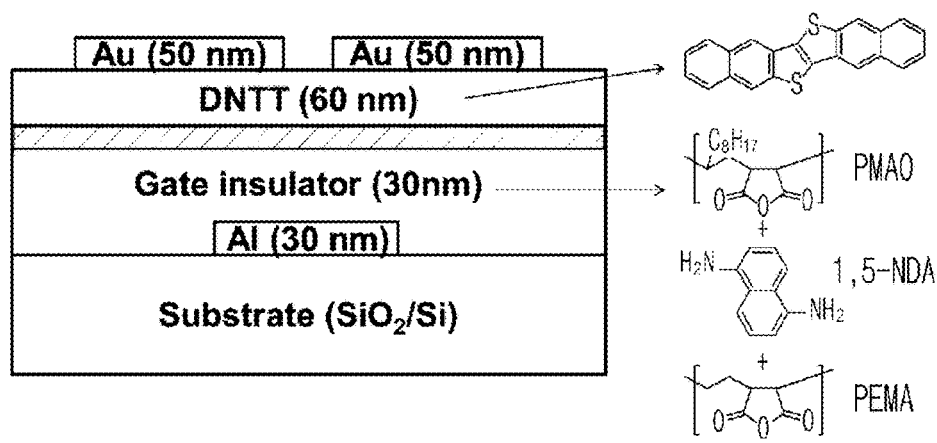
FIG. 1 is a diagram illustrating an example of the organic thin film transistor of the present invention.

Certain embodiments of the present invention are described in more detail with the attached figures hereinafter. However, the examples of the invention can be modified and presented in other embodiments. Thus, the present invention cannot be limited in the following embodiments described below. The embodiments of the present invention are provided to explain the present invention more precisely to those who have the standard knowledge in this art. Therefore, the shapes and the sizes of factors in the figures can be exaggerated and the factors indicated with the same mark are the same ones in the figures. Also, the factors having a similar function and action can be indicated with a same mark over the whole figures. In this specification, the word "include" means it can additionally include other components not to exclude other components unless indicated otherwise.

<Composition for Thin Film Transistor Insulator>

The present invention provides a composition for a thin film transistor insulator comprising poly(ethylene-alt-maleic anhydride) (PEMA), a cross-linking agent, and a polymer comprising the repeating unit represented by formula 1 below.

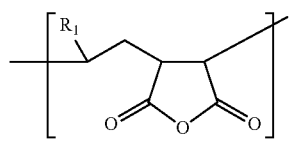

[Formula 1]

(In the formula 1, $R_1$ is $C_1$~$C_{22}$ straight or branched alkyl.).

Hereinafter, the composition for a thin film transistor insulator of the invention is described in more detail.

First, in the composition for a thin film transistor insulator of the invention, the weight average molecular weight ($M_w$) of poly(ethylene-alt-maleic anhydride) is 100,000~500,000 and the number average molecular weight (Mn) of the polymer is 30,000~50,000, but not always limited thereto.

The cross-linking agent above can be represented by formula 2 below.

$NH_2$-A-$NH_2$     [Formula 2]

(In the formula 2, A is a substance selected from the group consisting of $C_6$~$C_{14}$ arylene, $C_2$~$C_8$ straight alkylene, and $C_5$~$C_7$ cycloalkylene.).

At this time, the compound represented by formula 2 is preferably the compound that includes at least two amine groups, particularly, the compound is selected from the group consisting of 1,5-napthalenediamine, methylenediamine, p-phenyldiamine, ethylenediamine, 1,3-diaminopropane, 4,4'-oxydianiline, 1,4-diaminopropane, 4,4'-diaminobenzophenone, and tris(2-aminoethyl)amine.

In the formula 1, $R_1$ can be $C_1$~$C_{22}$ straight or branched alkyl, $C_3$~$C_{20}$ straight or branched alkyl, or $C_6$~$C_{18}$ straight or branched alkyl, but not always limited thereto.

Particularly, the compound represented by formula 1 can be poly(maleic anhydride-alt-1-octadecene comprising the repeating unit represented by formula 1a below.

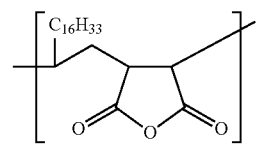

[Formula 1a]

In addition, the composition of the present invention can include:

i) poly(ethylene-alt-maleic anhydride): 73 weight %~92 weight %;

ii) cross-linking agent: 5 weight %~20 weight %; and iii) the polymer represented by formula 1: 1 weight %~10 weight %.

Preferably, the composition can include:

i) poly(ethylene-alt-maleic anhydride): 76 weight %~91 weight %;

ii) cross-linking agent: 7 weight %~18 weight %; and iii) the polymer represented by formula 1: 1 weight %~8 weight %.

More preferably, the composition can include:

i) poly(ethylene-alt-maleic anhydride): 80 weight %~90 weight %;

ii) cross-linking agent: 8 weight %~16 weight %; and iii) the polymer represented by formula 1: 2 weight %~6 weight %.

At this time, if poly(ethylene-alt-maleic anhydride) is added to the composition at the weight part of less than 73 weight % by the composition, the permittivity of the insulator formed from the composition would be decreased. If poly(ethylene-alt-maleic anhydride) is added to the composition at the concentration of over 92 weight % by the composition, the surface energy change on the insulator formed from the composition would not be as much.

If a cross-linking agent is added to the composition at the concentration of less than 5 weight % by the composition, the cross-linking reaction between the poly(ethylene-alt-maleic anhydride) and the polymer above would not be completed efficiently. On the other hand, if a cross-linking agent is added to the composition at the concentration of over 20 weight % by the composition, the electric properties of the insulator formed from with the composition would be poorer due to the remaining cross-linking agent after the cross-linking reaction.

Further, the polymer compound represented by formula 1 is added to the composition at the concentration of less than 1 weight % by the composition, the surface energy change would not be detectable on the insulator formed from the composition. In the meantime, if the polymer compound is added to the composition at the concentration of over 10 weight % by the composition, the insulation characteristics of the insulator would be deteriorated due to the increase of long alkyl chain included in the polymer compound.

As an example of the method for preparing the composition above, the following method is provided, wherein the second mixture prepared by mixing the second solvent and the polymer compound is added to the first mixture prepared by mixing the first solvent and poly(ethylene-alt-maleic anhydride) dropwise; and the third mixture prepared by mixing the first solvent and a cross-linking agent is loaded thereto.

The concentration of poly(ethylene-alt-maleic anhydride) in the first mixture is 3 weight %~6 weight %. The concentration of the polymer compound in the second mixture is 0.05 weight %~0.30 weight %. The concentration of the cross-linking agent in the third mixture is 3 weight %~6 weight %, but not always limited thereto.

The first solvent above can be γ-butyrolactone (GBL), N-methyl-pyrrolidone (NMP), dimethylacetamide (DMAc), or dimethyl sulfoxide (DMSO), and γ-butyrolactone (GBL) is more preferred, but not always limited thereto.

The second solvent above can be cyclohexanone, isophorone, methyl isoamyl ketone, dimethyl phthalate, propylene glycol methyl ether, propylene carbonate, or diacetone alcohol, and cyclohexanone is more preferred, but not always limited thereto.

<Insulator for Thin Film Transistor>

The present invention also provides an insulator film for a thin film transistor formed from the composition of the invention.

Hereinafter, the insulator film for a thin film transistor of the present invention is described in more detail.

The insulator can have $R_1$ functional group of the polymer compound on a part of the surface thereof. The insulator formed from the composition of the invention is prepared by cross-linking between poly(ethylene-alt-maleic anhydride) and the polymer compound above, and accordingly the $R_1$ functional group included in the polymer compound can be included on a part of the surface of the insulator.

The said $R_1$ can be $C_1$~$C_{22}$ straight or branched alkyl, $C_3$~$C_{20}$ straight or branched alkyl, or $C_6$~$C_{18}$ straight or branched alkyl.

The insulator above demonstrates a lowered surface energy and an excellent permittivity due to the alkyl group on a part of the surface of the insulator.

Particularly, the surface energy of the said insulator is 28 dyn/cm~38 dyn/cm, and the dielectric constant of the insulator is 2.5~4.2. The contact angle of the insulator is 85°~100°. This contact angle is higher than that of the insulator prepared from the composition comprising simply poly(ethylene-alt-maleic anhydride) and a cross-linking agent.

The thickness of the insulator above is 10 nm~400 nm, preferably 20 nm~200 nm, and more preferably 30 nm~60 nm.

If the thickness of the insulator is less than 10 nm, the insulating property of the insulator equipped in a capacitor or a thin film transistor would be reduced, leading to the increase of leakage current, which would be a problem. If the thickness of the insulator is more than 400 nm, the permittivity of the insulator layer in a capacitor or a thin film transistor would be significantly reduced, so that the driving voltage of the transistor would be raised significantly, which is also a problem.

<Method for Preparing Insulator for Thin Film Transistor>

The present invention also provides a method for preparing an insulator for a thin film transistor comprising the step of spreading the composition of the invention above on a substrate, followed by heat-treatment (step 1).

The said composition can be stirred for 6~18 hours before the spreading on a random substrate.

Next, the composition can be spread on a substrate by one of the methods selected from the group consisting of spin coating, roll coating, spraying coating, dip coating, flow coating, comma coating, kiss coating, die coating, doctor blade, and dispensing, but not always limited thereto.

The heat-treatment is performed at 70~110° C. for 5~20 minutes, and an additional heat-treatment can be performed at 120~180° C. for 20~60 minutes.

The thickness of the insulator prepared by the method above is 10 nm~400 nm, and preferably 20 nm~200 nm, and more preferably 30 nm~60 nm.

The thickness of the insulator above can be 10 nm~400 nm, preferably 20 nm 200 nm, and more preferably 30 nm~60 nm.

<Organic Thin Film Transistor>

The present invention also provides an organic thin film transistor comprising:

a gate electrode (21) formed on a substrate (11);

a gate insulator (31) comprising the gate electrode and the insulator formed on the substrate;

an organic semiconductor (41) formed on the gate insulator;

a source electrode (51) formed on the organic semiconductor; and a drain electrode (52).

Figure 2:
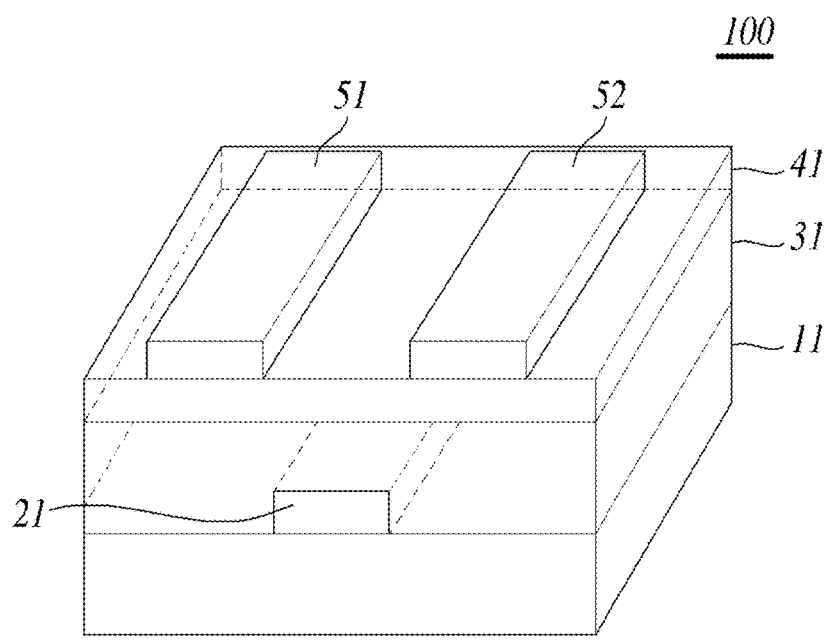
FIG. 2 is a schematic diagram illustrating an example of the organic thin film transistor of the present invention.

Herein, an example of the organic thin film transistor of the present invention is illustrated in FIG. 1 and FIG. 2.

Each component of the organic thin film transistor of the present invention is described in more detail hereinafter.

First, the organic thin film transistor (100) of the present invention is composed of the conventional transistor structure well informed to those in the art comprising the bottom gate and the top contact, but not always limited thereto.

The substrate (11) can be a silicon substrate on which silicon oxide ($SiO_2$) is formed.

The gate electrode (21) is deposited on the top of the substrate as a long wiring shape by vacuum evaporation. At this time, a material for the gate electrode can be a conductive metal such as aluminum or copper, but not always limited thereto.

Next, in the organic thin film transistor (100) of the present invention, the gate insulator (31) is formed on the gate electrode and the top of the substrate, and can include an insulator formed from the composition of the invention.

The thickness of the gate insulator (31) is 10 nm~400 nm, preferably 20 nm~200 nm, and more preferably 30 nm~60 nm.

If the thickness of the gate insulator (31) is less than 10 nm, the insulating property of the insulator equipped in a capacitor or a thin film transistor would be reduced, leading to the increase of leakage current, which would be a problem. If the thickness of the insulator is more than 400 nm, the permittivity of the insulator layer in a capacitor or a thin film transistor would be significantly reduced, so that the driving voltage of the transistor would be raised significantly, which is also a problem.

The gate insulator (31) can have $R_1$ functional group of the polymer compound on a part of the surface thereof. The insulator formed from the composition of the invention is prepared by cross-linking between poly(ethylene-alt-maleic anhydride) and the polymer compound above, and accordingly the $R_1$ functional group included in the polymer compound can be included on a part of the surface of the insulator.

The said $R_1$ can be $C_1 \sim C_{22}$ straight or branched alkyl, $C_3 \sim C_{20}$ straight or branched alkyl, or $C_6 \sim C_{18}$ straight or branched alkyl.

The gate insulator (31) above demonstrates a lowered surface energy and an excellent permittivity due to the alkyl group on a part of the surface of the insulator.

Particularly, the surface energy of the gate insulator (31) is 28 dyn/cm~38 dyn/cm, and the dielectric constant of the insulator is 2.5~4.2. The contact angle of the insulator is 85°~100°. This contact angle is higher than that of the insulator prepared from the composition comprising simply poly(ethylene-alt-maleic anhydride) and a cross-linking agent. Therefore, the gate insulator of the organic thin film transistor of the present invention can affect the crystallity of an organic semiconductor, which is going to be illustrated hereinafter, due to the lowered surface energy.

Next, in the organic thin film transistor of the present invention, the organic semiconductor (41) formed on the gate insulator above can be DNTT (dinaphtho[2,3-b:2',3'-f]thieno[3,2-b]thiophene), pentacene, tetracene, oligo thiophene, polythiophene, metal phthalocyanine, polyphenylene, polyvinylenephenylene, polyfluorene, or fullerene ($C_{60}$), among which DNTT (dinaphtho[2,3-b:2',3'-f]thieno[3,2-b]thiophene) is preferred, but any organic semiconductor that is acceptable by those in the art can be used without limitation.

The thickness of the organic semiconductor (41) above is 40 nm~80 nm, but not always limited thereto.

The organic semiconductor (41) can be grown from a three-dimensional island due to the low surface energy of the bottom gate insulator (31).

In the organic semiconductor (41) above, the adhesion energy is preferably smaller than the cohesion energy. At this time, the organic semiconductor molecules form three-dimensional islands on the gate insulator (31) to cover the gate insulator.

If the gate insulator (31) has a high surface energy, the organic semiconductor on the gate insulator is formed from a two-dimensional island, and form rough grains in the early stage, which does not have a beneficiary effect on charge carrier mobility.

In the organic thin film transistor (100) of the present invention, the source electrode (51) and the drain electrode (52) formed on the organic semiconductor can be formed in a long wiring shape on the organic semiconductor (41). At this time, the source electrode and the drain electrode can be formed on the top surface of the organic semiconductor via vacuum evaporation, wherein gold (au) can be used and the thickness can be 30 nm~70 nm. The material and form of the source electrode and the drain electrode are not limited thereto if they can be commonly used by those in the art.

The organic thin film transistor (100) of the present invention improves the morphology of the organic semiconductor (41) formed on the gate insulator due to the alkyl group on the surface of the gate insulator (31), and thus leakage current density is reduced; charge carrier mobility is improved; and current on/off ratio can be increased as well.

<Method for Preparing Organic Thin Film Transistor>

The present invention also provides a method for preparing an organic thin film transistor (100) comprising the following steps:

forming a gate electrode (21) on a substrate (11) (step a);

forming a gate insulator (31) by spreading the composition above on the substrate and the gate electrode, followed by heat-treatment (step b);

forming an organic semiconductor (41) on the gate insulator (step c); and forming a source electrode (51) and a drain electrode (52) on the organic semiconductor (step d).

Hereinafter, the method for preparing an organic thin film transistor (100) of the invention is described in more detail step by step.

In the method for preparing an organic thin film transistor (100) of the invention, step a is to form a gate electrode (21) on a substrate (11).

At this time, the substrate can be a silicon substrate on which silicon oxide ($SiO_2$) is formed. The gate electrode can be formed on the substrate by vacuum evaporation using a shadow mask.

For the gate electrode above, a highly conductive material such as aluminum (Al) can be used, but not always limited thereto.

The pressure for the vacuum evaporation can be $2 \times 10^{-6}$ Torr~$4 \times 10^{-6}$ Torr, but not always limited thereto, and the pressure can be adjusted in a range where the vacuum evaporation can be efficiently done.

The gate electrode (21) formed at this time can be formed in a long wiring shape, but not always limited thereto.

Next, in the method for preparing an organic thin film transistor (100) of the present invention, step b is to form a gate insulator (31) by spreading the composition of the invention on the substrate and the gate electrode, followed by heat-treatment.

The said composition can be stirred for 6~18 hours before the spreading on the gate insulator (31).

Next, the composition can be spread on the gate insulator (31) by one of the methods selected from the group consisting of spin coating, roll coating, spraying coating, dip coating, flow coating, comma coating, kiss coating, die coating, doctor blade, and dispensing, but not always limited thereto.

The heat-treatment can be performed at 70~110° C. for 5~20 minutes, and an additional heat-treatment can be performed at 120~180° C. for 20~60 minutes.

The thickness of the gate insulator (41) prepared by the method above is 10 nm 400 nm, preferably 20 nm~200 nm, and more preferably 30 nm~60 nm.

Next, in the method for preparing an organic thin film transistor (100), step c is to form an organic semiconductor (41) on the gate insulator.

At this time, the organic semiconductor (41) can be DNTT (dinaphtho[2,3-b:2',3'-f]thieno[3,2-b]thiophene), pentacene, tetracene, oligo thiophene, polythiophene, metal phthalocyanine, polyphenylene, polyvinylenephenylene, polyfluorene, or fullerene ($C_{60}$), among which DNTT (dinaphtho[2,3-b:2',3'-f]thieno[3,2-b]thiophene) is preferred, but not always limited thereto.

The organic semiconductor (41) can be formed via vacuum evaporation using a shadow mask.

The pressure for the vacuum evaporation is $2 \times 10^{-6}$ Torr~$4 \times 10^{-6}$ Torr, but not always limited thereto and the pressure can be adjusted in a range where the vacuum evaporation can be efficiently done.

The evaporation rate is 0.1 Å/s~0.5 Å/s, but not always limited thereto and can be adjusted in a range where the evaporation can be efficiently done.

In the method for preparing an organic thin film transistor (100) of the present invention, step d is to form a source electrode (51) and a drain electrode (52) on the organic semiconductor above.

At this time, for the source electrode and the drain electrode, gold (au) can be used, but not always limited thereto.

The source electrode (51) and the drain electrode (52) can be formed via vacuum evaporation using a shadow mask.

The pressure for the vacuum evaporation is $2 \times 10^{-6}$ Torr~$4 \times 10^{-6}$ Torr, but not always limited thereto and the pressure can be adjusted in a range where the vacuum evaporation can be efficiently done.

The thickness of the source electrode and the drain electrode formed thereby is 30~70 nm. The source electrode and the drain electrode formed at this time can be formed in a long wiring shape, but not always limited thereto.

Practical and presently preferred embodiments of the present invention are illustrative as shown in the following Examples and Experimental Examples.

However, it will be appreciated that those skilled in the art, on consideration of this disclosure, may make modifications and improvements within the spirit and scope of the present invention.

In the following Examples and Experimental Examples, poly(maleic anhydride-alt-1-octadecene) is abbreviated as PMAO, 1,5-naphthalenediamine is abbreviated as 1,5-NDA, poly(ethylene-alt-maleic anhydride) is abbreviated as PEMA, and dinaphtho[2,3-b:2',3'-f]thieno[3,2-b]thiophene is abbreviated as DNTT.

Example 1: Preparation of a Composition Comprising PEMA, 1,5-NDA, and PMAO

Cyclohexanone solution containing 0.12 weight % of poly(maleic anhydride-alt-1-octadecene) was added to gamma-butyrolactone solution containing 4.4 weight % of poly(ethylene-alt-maleic anhydride). Then, gamma-butyrolactone solution containing 4.4 weight % of 1,5-naphthalenediamine was loaded to the mixture above, wherein the weight ratio of poly(ethylene-alt-maleic anhydride):1,5-naphthalenediamine:poly(maleic anhydride-alt-1-octadecene) was adjusted to be 87:10:3.

Example 2: Preparation of an Insulator by Cross-Linking PEMA and PMAO

The composition prepared in Example 1 was stirred for 12 hours. The stirred composition was coated on a substrate by spin-coating, followed by heat-treatment at 90° C. for 10 minutes and at 160° C. for 40 minutes. As a result, a 30 nm thick insulator was prepared.

Example 3: Preparation of a MIM (Metal-Insulator-Metal) Capacitor Comprising an Insulator Prepared by Cross-Linking PEMA and PMAO To prepare a MIM capacitor, a silicon substrate on which silicon oxide is formed was prepared. An aluminum (Al) electrode in the thickness of 30 nm was formed on the top surface of the substrate.

Then, the composition prepared in Example 1 was stirred for 12 hours. The substrate on which the aluminum electrode is formed was coated with the composition by spin-coating, followed by heat-treatment at 90° C. for 10 minutes, and additionally at 160° C. for 40 minutes. As a result, a 30 nm thick insulator was prepared.

Lastly, a gold (au) electrode in the thickness of 50 nm was formed on the top surface of the insulator. As a result, a MIM capacitor having the active area of 50.24 mm$^2$ was prepared.

Example 4: Preparation of a DNTT Organic Semiconductor on the Insulator Wherein PEMA and PMAO are Cross-Linked The composition prepared in Example 1 was spread on a random substrate, followed by heat-treatment to form an insulator. DNTT (dinaphtho[2,3-b:2',3'-f]thieno[3,2-b]thiophene) was deposited on the top surface of the insulator by vacuum evaporation using a shadow mask. The pressure for the vacuum evaporation was $3 \times 10^{-6}$ Torr, and the evaporation rate was 0.3 Å/s. As a result, a DNTT organic semiconductor in the thickness of 60 nm was prepared.

Example 5: Preparation of an Organic Thin Film Transistor

Step a: A silicon substrate having silicon oxide formed on the surface thereof was prepared. Vacuum evaporation was performed on the surface of the substrate with the pressure of $3 \times 10^{-6}$ Torr using a shadow mask to form an aluminum (Al) gate electrode in a wiring shape. At this time, the thickness of the aluminum gate electrode was 30 nm and the width of the wiring was 2 mm.

Step b: The composition prepared in Example 1 was stirred for 12 hours, followed by spin coating on the substrate and the gate electrode in order to form a gate insulator on the top surface of the substrate and the gate electrode. Then, heat-treatment was performed at 90° C. for 10 minutes, followed by additional heat-treatment at 160° C. for 30 minutes to form a gate insulator.

Step c: DNTT (dinaphtho[2,3-b:2',3'-f]thieno[3,2-b]thiophene) was deposited on the top surface of the gate insulator by vacuum evaporation using a shadow mask. The pressure for the vacuum evaporation was $3 \times 10^{-6}$ Torr and the evaporation rate was 0.3 Å/s. As a result, a DNTT organic semiconductor in the thickness of 60 nm was prepared.

Step d: Each electrode made of gold (Au) was formed on the top surface of the organic semiconductor by vacuum evaporation using a shadow mask in order to form a source electrode and a drain electrode.

Each of the source electrode and the drain electrode was prepared in a wiring shape. An organic thin film transistor was prepared such that the length of the channel, which is the distance between the electrodes, was 50 μm and the length of each electrode in a wiring shape was 1000 μm.

Comparative Example 1: Preparation of a Composition Comprising PEMA and 1,5-NDA

Gamma-butyrolactone solution containing 1,5-naphthalenediamine at the concentration of 3.2 weight % was added to gamma-butyrolactone solution containing poly(ethylene-alt-maleic anhydride) at the concentration of 3.2 weight %. At this time, the weight ratio of poly(ethylene-alt-maleic anhydride):1,5-naphthalenediamine was adjusted to 9:1 for the preparation of the composition of the invention.

Comparative Example 2: Preparation of a PEMA Cross-Linked Insulator

An insulator was prepared by the same manner as described in Example 2 except that the composition of Comparative Example 1 was used in order to form the insulator.

Comparative Example 3: Preparation of a MIM (Metal-Insulator-Metal) Capacitor Comprising a PEMA Cross-Linked Insulator A MIM (metal-insulator-metal) capacitor was prepared by the same manner as described in Example 3 except that the composition prepared in Comparative Example 1 was used in order to form an insulator.

Comparative Example 4: Preparation of a DNTT Organic Semiconductor on the PEMA Cross-Linked Insulator A DNTT (dinaphtho[2,3-b:2',3'-f]thieno[3,2-b]thiophene) organic semiconductor was prepared by the same manner as described in Example 4 except that the composition prepared in Comparative Example 1 was used in order to form an insulator.

Comparative Example 5: Preparation of an Organic Thin Film Transistor Comprising the PEMA Cross-Linked Insulator An organic thin film transistor was prepared by the same manner as described in Example 5 except that the composition prepared in Comparative Example 1 was used in order to form an insulator in step b of Example 5.

Experimental Example 1: Analysis of the Surface of the Insulator Wherein PEMA and PMAO are Cross-Linked To investigate the surface morphology and characteristics of the insulator wherein PEMA and PMAO are cross-linked according to the present invention, the contact angle of the insulators prepared in Example 2 and Comparative Example 2 was measured by using water and diiodomethane. The surface energy and roughness were measured by using (atomic force microscope, Nanoscope IV, Digital Instrument) and the results are shown in FIG. 3.

Figure 3:
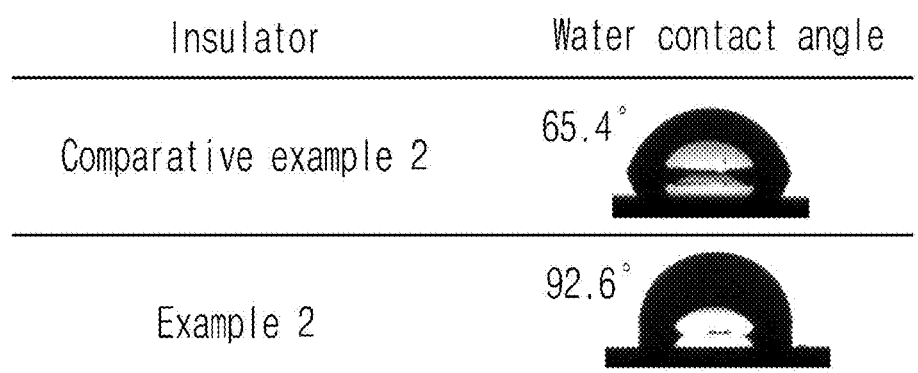
FIG. 3 is a set of photographs illustrating the water contact angle of the insulators of Example 2 and Comparative Example 2 of the present invention.

As shown in FIG. 3, the water contact angle of the insulator of Example 2 wherein PEMA and PMAO are cross-linked was 92.6° and the surface energy thereof was 32.4 dyn/cm, while the water contact angle of the insulator of Comparative Example 2 was 65.4 and the surface energy thereof was 49.3 dyn/cm.

That is, the surface characteristics of PEMA were improved by adding a small amount of PMAO along with 1,5-DNA, and when alkyl of PMAO was aligned vertically to the surface, the surface energy of the insulator was lowed.

Figure 4:
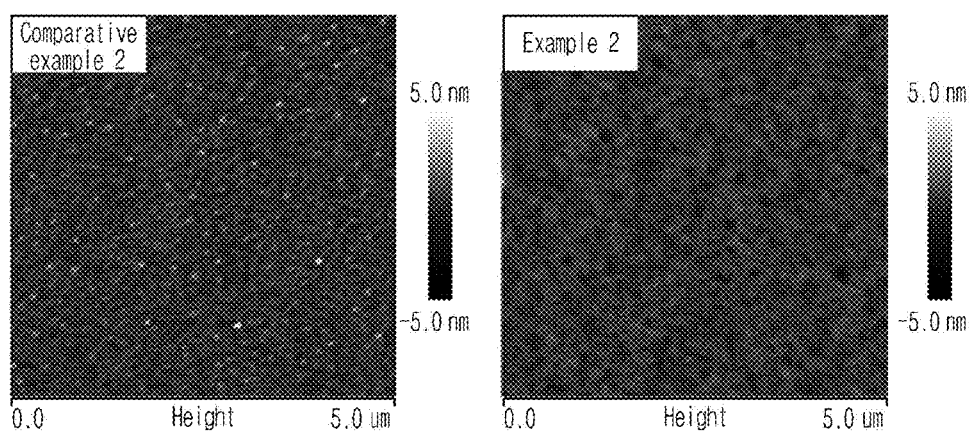
FIG. 4 is a set of atomic force photomicroscopes illustrating the surface morphology of the insulators of Example 2 and Comparative Example 2 of the present invention.

Further, as shown in FIG. 4, the roughness of the insulator wherein PEMA and PMAO are cross-linked was up to 0.5 nm, and the surface damage due to PMAO was not observed.

Experimental Example 2: Analysis of the MIM (Metal-Insulator-Metal) Capacitor Comprising the Insulator Wherein PEMA and PMAO are Cross-Linked To investigate the characteristics of the MIM (metal-insulator-metal) capacitor comprising the insulator wherein PEMA and PMAO are cross-linked according to the present invention, the frequency dependent electrostatic capacity and the electric field dependent leakage current density of the MIM capacitors prepared in Example 3 and Comparative Example 3 were measured by using an impedance analyzer (Agilent, 4294A). The results are shown in FIG. 5 and Table 1.

Figure 5:
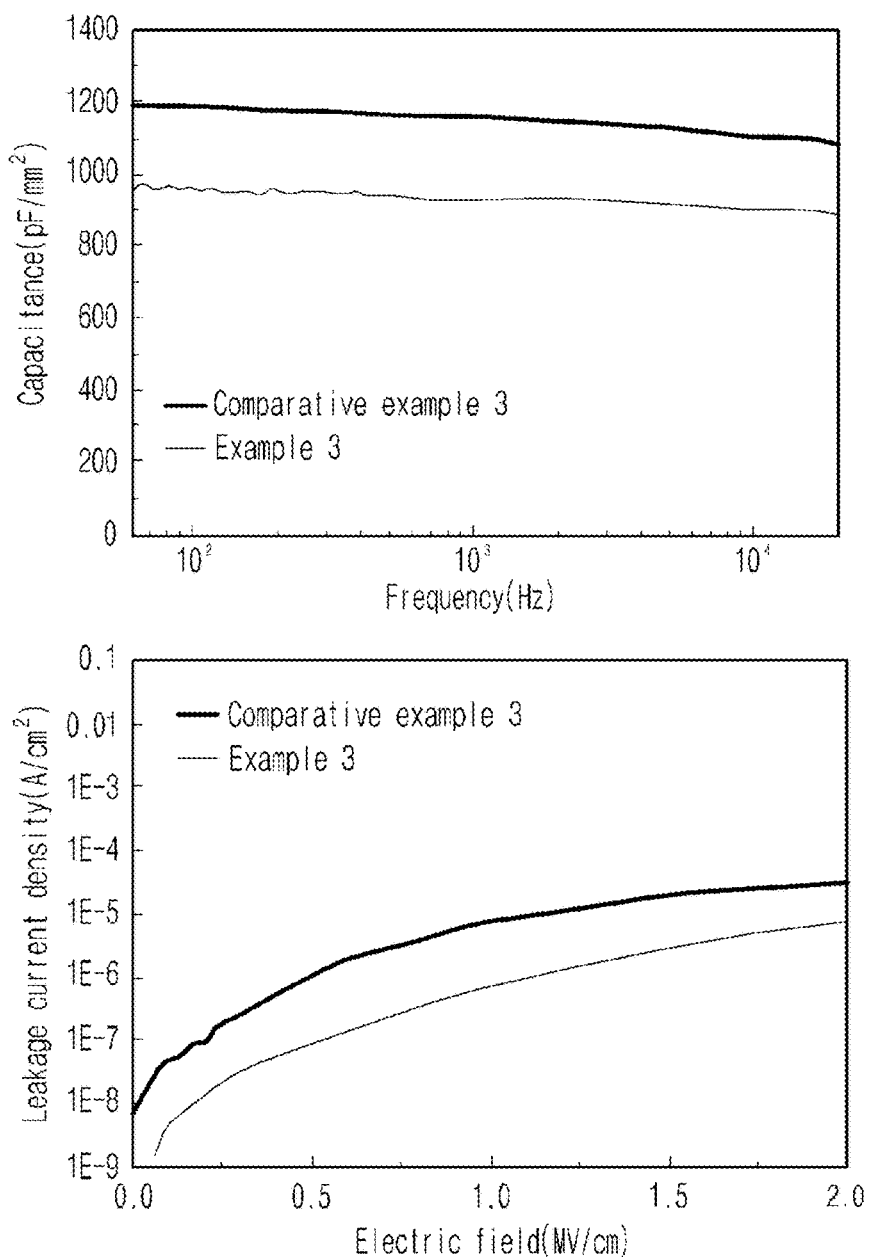
FIG. 5 is a set of graphs illustrating the frequency-dependent capacitance and electric field-dependent leakage current density of the capacitors of Example 3 and Comparative Example 3 of the present invention.

As shown in FIG. 5, the electrostatic capacity of the MIM (metal-insulator-metal) capacitor of Example 3 comprising the insulator wherein PEMA and PMAO are cross-linked was 980 pF/mm$^2$ at 60 Hz and the dielectric constant thereof was 3.5. The electrostatic capacity of the capacitor of Comparative Example 3 comprising the PEMA cross-linked insulator was 1200 pF/mm$^2$ at 60 Hz and the dielectric constant was 4.1.

The electrostatic capacity and the permittivity according to the PEMA/PMAO cross-linking were slightly reduced, which was confirmed to be attributed to the decrease of the polymer chain packing density caused by the alkyl group on the surface of the capacitor of Example 3.

As shown in FIG. 5, the leakage current density of the MIM (metal-insulator-metal) capacitor of Example 3 was $7.7 \times 10^{-6}$ A/cm$^2$ in the electric field of 2 MV/cm, while the leakage current density of the capacitor of Comparative Example 3 was $3.4 \times 10^{-5}$ A/cm$^2$ in the electric field of 2 MV/cm, suggesting that the leakage current density was reduced by the cross-linking between PEMA and PMAO.

TABLE 1

|  | Dielectric constant* | Leakage current density** (A/cm$^2$) | Surface roughness (nm) | Surface energy (dyn/cm) |
|---|---|---|---|---|
| Comparative Example 3 | 4.1 | 3.4 10−5 | 0.49 | 49.3 |
| Example 3 | 3.5 | 7.7 10−6 | 0.50 | 32.4 |

(*measured at 60 Hz, **measured at 2 MV/cm)

For the operation of a low-voltage organic thin film transistor, the thickness of a gate insulator should be thin. In general, as the thickness of an organic gate insulator decreases, its electrical insulation capability also decreases. According to the decrease of the thickness of a gate insulator, such electric pathways as grain boundaries and pinholes are increased in a certain circumstance.

However, the insulator wherein PEMA and PMAO are cross-linked displays a reasonable insulating capability in a thin thickness of 30 nm. The insulator having cross-linked PEMA/PMAO displays a two-layered structure, wherein the leakage current pathway can be inhibited by the suppression or destruction of defects, grain boundaries, and cluster aggregation.

Experimental Example 3: Analysis of Morphology of the DNTT Organic Semiconductor Comprising the Insulator Wherein PEMA and PMAO are Cross-Linked To investigate the surface morphology of the DNTT (dinaphtho[2,3-b:2',3'-f]thieno[3,2-b]thiophene) organic semiconductor comprising the insulator wherein PEMA and PMAO are cross-linked, the morphology of the DNTT organic semiconductors prepared in Example 4 and Comparative Example 4 was observed using AFM (atomic force microscope, Nanoscope IV, Digital Instrument). The results are shown in FIG. 6 and FIG. 7.

Figure 6:
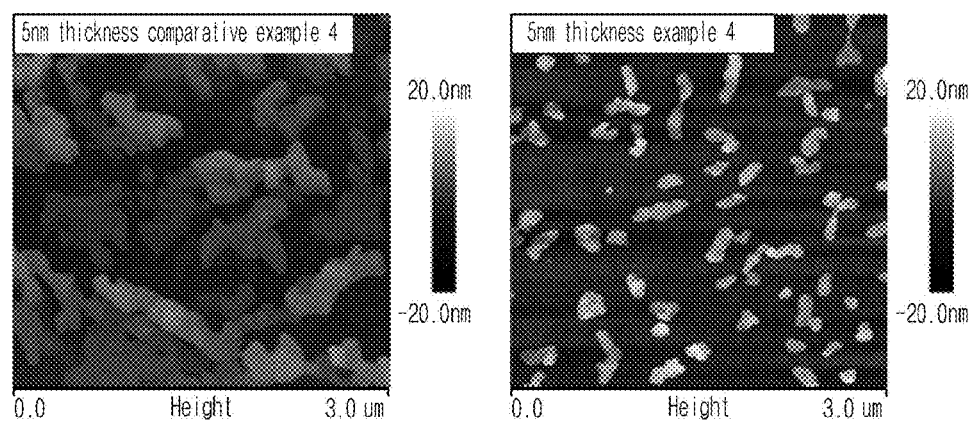
FIG. 6 and FIG. 7 are atomic force photomicroscopes illustrating the surface morphology of the organic semiconductors of Example 4 and Comparative Example 4 of the present invention over the growth of DNTT.
Figure 7:
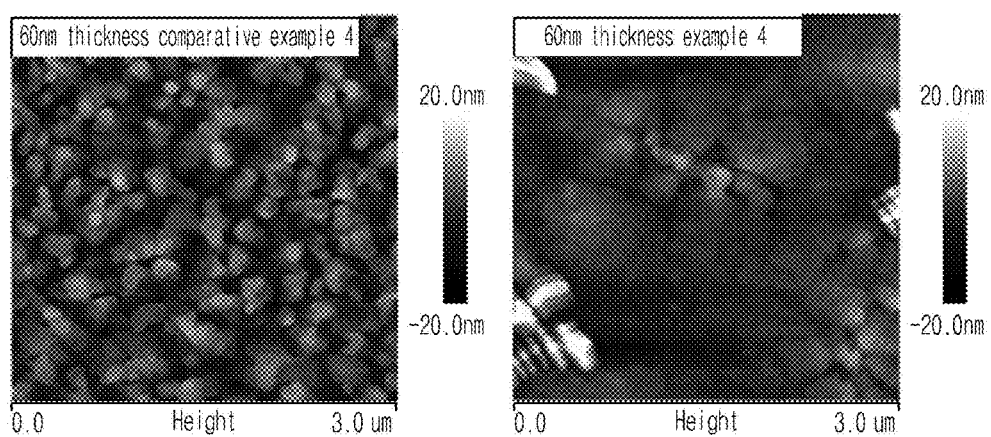

As shown in FIG. 6, the DNTT (dinaphtho[2,3-b:2',3'-f]thieno[3,2-b]thiophene) organic semiconductor comprising the insulator wherein PEMA and PMAO are cross-linked displayed 3-dimensional islands formed thereon in the early growing stage in Example 4. At this time, DNTT molecules were tightly conjugated compared with those in the gate insulator, which was because the DNTT cohesive energy was bigger than the gate insulator contact energy of DNTT. Therefore, DNTT molecules formed 3-dimensional islands instead covered the gate insulator. When more DNTT molecules were added, the 3-dimensional islands were enlarged horizontally.

In the meantime, the DNTT organic semiconductor of Comparative Example 4 containing the PEMA cross-linked insulator displayed many 2-dimensional islands in the early growing stage. When more DNTT molecules were added, the 2-dimensional islands were enlarged horizontally to form coarse grains. The early $2^{nd}$ layer and $3^{rd}$ layer in the DNTT growing stage in Comparative Example 4 are illustrated in FIG. 6. The unstable layer could limit the charge transfer even with coarse grains.

At this time, the surface energy and cohesive energy of DNTT were 44.7 dyn/cm and 89.4 dyn/cm respectively. The adhesion energy between the insulator having cross-linked PEMA/PMAO and DNTT was 74.7 dyn/cm. The adhesion energy between the PEMA cross-linked insulator and DNTT was 93.6 dyn/cm. These results indicate that the adhesion energy is related to the DNTT growth mode.

Experimental Example 4: Analysis of Characteristics of the Organic Thin Film Transistor Comprising the Insulator Wherein PEMA and PMAO are Cross-Linked 1

Figure 8:
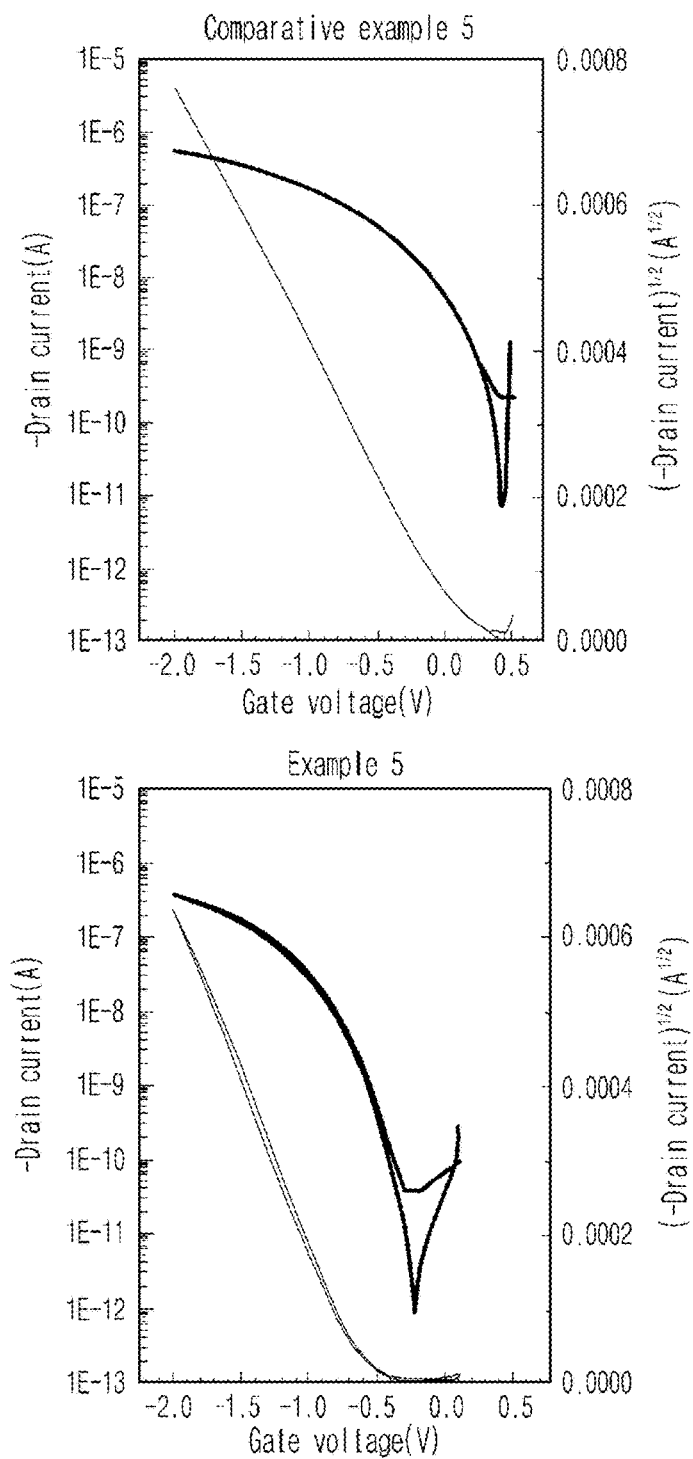
FIG. 8 is a set of graphs illustrating the -drain current and -drain current$^{1/2}$ of the transistors of Example 5 and Comparative Example 5 of the present invention over the gate voltage.

To investigate the characteristics of the organic thin film transistor comprising the insulator wherein PEMA and PMAO are cross-linked according to the present invention, the output voltage-current characteristics, field effect mobility, subthreshold slope, threshold voltage, and on/off current ratio of the organic thin film transistors prepared in Example 5 and Comparative Example 5 were measured by using a semiconductor parameter analyzer (Agilent, E5272) and the results are shown in FIG. 8 and Table 2.

As shown in FIG. 8 and Table 2, the organic thin film transistor comprising the insulator wherein PEMA and PMAO are cross-linked which was prepared in Example 5 displayed the mobility of 0.24 cm²/v·s at low-voltage operation (0 V or 0.5 V~−2 V, −2 V~0.5 V or 0 V), the threshold voltage of −0.62 V, the subthreshold slope of 0.071, and the on/off current ratio of $4.5 \times 10^5$, which suggested that the organic thin film transistor of Example 5 had improved device performance compared with the organic thin film transistor comprising the PEMA cross-linked insulator of Comparative Example 5.

TABLE 2

|  | Mobility (cm²/v · s) | Threshold voltage (V) | Subthreshold slope | On/off current ratio |
|---|---|---|---|---|
| Comparative Example 5 | 0.11 | 0.16 | 0.10 | $7.4 \times 10^4$ |
| Example 5 | 0.24 | −0.62 | 0.071 | $4.5 \times 10^5$ |

<BRIEF DESCRIPTION OF THE MARK OF DRAWINGS>

| 11: substrate | 21: gate electrode |
|---|---|
| 31: gate insulator | 41: organic semiconductor |
| 51: source electrode | 52: drain electrode |
| 100: organic thin film transistor | |

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

What is claimed is:

1. A composition for a thin film transistor insulator comprising poly(ethylene-alt-maleic anhydride) (PEMA) in an amount of 73 weight %-92 weight %, a cross-linking agent in an amount of 5 weight %-20 weight %, and a polymer compound comprising the repeating unit represented by formula 1 below in an amount of 1 weight %-10 weight %:

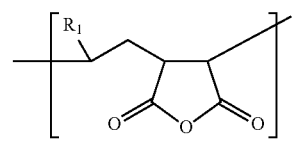

[Formula 1]

wherein, in the formula 1, $R_1$ is a $C_1$~$C_{22}$ straight or branched alkyl.

2. The composition for a thin film transistor insulator according to claim 1, wherein the $R_1$ of formula 1 is a $C_6$~$C_{18}$ straight or branched alkyl.

3. The composition for a thin film transistor insulator according to claim 1, wherein the weight average molecular weight ($M_w$) of the poly(ethylene-alt-maleic anhydride) is 100,000~500,000 and the number average molecular weight ($M_n$) of the polymer compound is 30,000~50,000.

4. The composition for a thin film transistor insulator according to claim 1, wherein the cross-linking agent is represented by formula 2 below:

$NH_2$-A-$NH_2$  [Formula 2]

wherein, in the formula 2, A is a substance selected from the group consisting of a $C_6$~$C_{14}$ arylene, $C_2$~$C_8$ straight alkylene, and $C_5$~$C_7$ cycloalkylene.

5. An insulator for a thin film transistor formed from the composition of claim 1.

6. The insulator for a thin film transistor according to claim 5, wherein the insulator contains the $R_1$ functional group of the polymer compound on a part of a surface of the insulator.

7. The insulator for a thin film transistor according to claim 5, wherein the thickness of the insulator is 10 nm~400 nm.

8. A method for preparing an insulator for a thin film transistor comprising the step of spreading the composition of claim 1 on a substrate, followed by heat-treatment (step 1).

9. An organic thin film transistor comprising:
a gate electrode formed on a substrate;

a gate insulator comprising the insulator of claim 5 formed on the gate electrode;

an organic semiconductor formed on the gate insulator;

a source electrode formed on the organic semiconductor; and a drain electrode.

10. The organic thin film transistor according to claim 9, wherein the organic semiconductor is one or more semiconductors selected from the group consisting of DNTT (dinaphtho[2,3-b:2',3'-f]thieno[3,2-b]thiophene), pentacene, tetracene, oligo thiophene, polythiophene, metal phthalocyanine, polyphenylene, polyvinylenephenylene, polyfluorene, and fullerene ($C_{60}$).

\* \* \* \* \*